United States Patent
Matsui et al.

(10) Patent No.: US 7,698,667 B2
(45) Date of Patent: Apr. 13, 2010

(54) PATTERN CORRECTION APPARATUS, PATTERN OPTIMIZATION APPARATUS, AND INTEGRATED CIRCUIT DESIGN APPARATUS

(75) Inventors: Mitsukiyo Matsui, Kanagawa (JP); Tarou Fukunaga, Kanagawa (JP); Mie Yamanaka, Kanagawa (JP); Hiroki Tomoshige, Kanagawa (JP); Maya Ishino, Kanagawa (JP); Muneaki Kyoya, Tokyo (JP); Satoru Nishioka, Kanagawa (JP)

(73) Assignee: Panasonic Corporation, Osaka (JP)

( * ) Notice: Subject to any disclaimer, the term of this patent is extended or adjusted under 35 U.S.C. 154(b) by 225 days.

(21) Appl. No.: 11/822,905

(22) Filed: Jul. 11, 2007

(65) Prior Publication Data

US 2008/0028344 A1 Jan. 31, 2008

(30) Foreign Application Priority Data

Jul. 11, 2006 (JP) .............................. 2006-190461

(51) Int. Cl.
*G06F 17/50* (2006.01)
(52) U.S. Cl. .................. 716/2; 716/1; 716/3; 716/12; 716/13; 716/14; 716/18
(58) Field of Classification Search .................. 716/1–3, 716/8–14, 18
See application file for complete search history.

(56) References Cited

U.S. PATENT DOCUMENTS

| 6,571,379 | B2 * | 5/2003 | Takayama ..................... 716/10 |
| 6,792,593 | B2 | 9/2004 | Takashima et al. |
| 2004/0041281 | A1 * | 3/2004 | Sakai et al. .................. 257/784 |
| 2006/0117289 | A1 | 6/2006 | Katagiri |
| 2006/0136848 | A1 * | 6/2006 | Ichiryu et al. .................. 716/1 |

FOREIGN PATENT DOCUMENTS

JP 2005-301799 10/2005

\* cited by examiner

*Primary Examiner*—Thuan Do
*Assistant Examiner*—Nghia M Doan
(74) *Attorney, Agent, or Firm*—McDermott Will & Emery LLP

(57) ABSTRACT

To provide a pattern correction apparatus which enables easy correction of a trace which is not present on trace grids, a pattern correction apparatus which makes a correction to a pattern of an integrated circuit includes a trace movement section for moving, among traces forming the pattern of the integrated circuit, a trace which is not present on trace grids to a position above the trace grids; a pattern correction section for making a correction to the pattern; and a trace pitch optimization section for optimizing a trace pitch between traces forming a pattern corrected by the pattern correction section.

2 Claims, 19 Drawing Sheets

INFORMATION ABOUT TRACE PATTERN TO BE SUBJECTED TO OPTIMIZATION OF TRACE PITCH, INFORMATION ABOUT TRACE PATTERN ON TRACE GRIDS

▨ TRACE PATTERN TO BE SUBJECTED TO OPTIMIZATION OF TRACE PITCH

PATTERN CORRECTION APPARATUS, PATTERN OPTIMIZATION APPARATUS, AND INTEGRATED CIRCUIT DESIGN APPARATUS

FOREIGN PRIORITY

In accordance with the provisions of 35 U.S.C. § 119, Applicants hereby claim the priority of Japanese Patent Application Number JP 2006-190461, filed on Jul. 11, 2006 cited in the Declaration of the present application.

BACKGROUND OF THE INVENTION

1. Field of the Invention

The present invention relates to a pattern correction apparatus, a pattern optimization apparatus, and an integrated circuit design apparatus for correcting, optimizing, and designing a pattern of an integrated circuit.

2. Description of the Related Art

With a leap progress in LSI manufacturing techniques, an ultrafine process called deep submicron has been used. From a physical viewpoint, further miniaturization a process poses difficulty in designing a layout. Moreover, in relation to a signal delay (a gate delay or a trace delay), the influence of a trace delay becomes greater, and hence a contrivance to trace design is required.

In association with the shorter life of LSI products, yields of the LSI manufacturing technique must be enhanced immediately. For instance; in order to realize a design for simpler production, a commitment to a DFM (Design For Manufacturing) technique is sought. Improvements in design quality and reductions in fraction defective are sought not only in the field of LSIs for use in automobiles but also in the field of consumer-oriented or industrial LSIs.

What greatly affects a trace delay as a result of a reduction in the minimum pitch between wires associated with recent miniaturization is crosstalk. A principle approach for avoiding occurrence of crosstalk is a reduction in inter-trace capacitance and asynchronous switching among adjacent wires. A method for increasing a trace pitch is available for reducing inter-trace capacitance. For example, in connection with layout data acquired after detailed routing, a trace pitch disregarding trace grids is enlarged by use of an automatic layout tool.

Next, a finer design rule poses extreme difficulty in mask processing, which in turn raises a problem of deteriorated yields and a failure to manufacture an LSI at worst. These problems are attributable to a graphics pattern of a semiconductor mask being finer than the wavelength of light used for exposure. Further, at some locations, the problems are attributable to a layout relationship between wires and vias. For example, when denseness and nondenseness are present in the pattern, it may be the case where a pattern cannot be transferred accurately.

Although degeneration failure or open failure is detected by use of a test pattern, detecting all nodes is difficult to perform. There is the possibility of a short circuit or a break arising between traces as a result of minute dust or extraneous matters having adhering to nodes (undetected nodes) that cannot be detected by means of the test pattern, to thus cause product deficiency.

An example of the technique for creating a layout pattern which is intended for reducing the chance of occurrence of a cross talk in an LSI or enhancing yields is described in JP-A-2005-301799. Correction of a layout of a pattern of an integrated circuit will be described briefly by reference to FIG. 28.

As shown in FIG. 28, a method for correcting a pattern of an integrated circuit comprises selecting an arbitrary trace pattern by means of taking, as an input, pattern information (21-1) which is an aggregate of trace patterns (step 21-2); computing the degree of adjacent balance from inter-trace capacitance between a trace pattern R selected in step 21-2 and a trace pattern adjacent to the trace pattern R (step 21-3); and moving the position of an adjacent trace pattern in accordance with the degree of adjacent balance computed in step 21-3 (step 21-4).

According to the above method, an adjacent trace pattern is moved in accordance with the degree of adjacent balance determined from inter-trace capacitance developing between a selected trace pattern and an adjacent trace pattern, so that a trace pitch can be increased when compared with a trace pitch determined by the original trace pattern. Therefore, optimization of timing of an LSI chip and realization of a layout which diminishes crosstalk are possible, and yields can be enhanced.

Patent Document 1: JP-A-2005-301799

However, under the previously described method for correcting a pattern of an integrated circuit, when a necessity for correcting a trace pattern after optimization of a trace pitch has arisen, it is difficult to correct a trace which is not present on any trace grid by use of an automatic routing tool. Even if correction of the trace is feasible, enormous time is consumed. Further, an evaluation function does not include vias, it may be the case where yields are reduced by means of denseness and nondenseness of the graphics pattern. In association with further miniaturization of a process in future, denseness and nondenseness of a graphics pattern pertaining to vias must also be taken into consideration.

Moreover, a fraction defective in the market (hereinafter called a "market fraction defective") is computed from the rate of detection of degeneration failures acquired by use of a test pattern. However, in association with miniaturization of a process, a market fraction defective cannot be ascertained by means of a parameter including only the rate of detection of failures determined through use of a test pattern. Further, since graphic pattern information is not included in parameters used for computing a fraction defective, graphics pattern correction for diminishing a market fraction defective cannot be made.

SUMMARY OF THE INVENTION

An objective of the present invention is to provide a pattern correction apparatus which enables easy correction of a trace which is not present on any trace grid. Another objective of the present invention is to provide a pattern optimization apparatus which can prevent a decrease in yields attributable to denseness and nondenseness of vias. Still another objective of the present invention is to provide an integrated circuit design apparatus which enables highly-accurate computation of a market fraction defective.

The present invention provides a pattern correction apparatus which makes a correction to a pattern of an integrated circuit, comprising:

a trace movement section for moving, among traces forming the pattern of the integrated circuit, a trace which is not present on trace grids to a position above the trace grids;

a pattern correction section for making a correction to the pattern; and a trace pitch optimization section for optimizing a trace pitch between traces forming a pattern corrected by the pattern correction section.

In the pattern correction apparatus, a correction is made to a pattern of an integrated circuit where timing violation has arisen as a result of verification of the pattern.

In the pattern correction apparatus, the trace movement section selects one from traces forming the pattern, determines whether or not the selected trace is present on trace grids, moves the trace that is not present on the trace grids to neighbor trace grids, and creates graphics information about a pattern formed from the trace moved to a position above the trace grids.

In the pattern correction apparatus, the pattern correction section creates graphics information about the corrected pattern, selects one trace from traces constituting the corrected pattern, determines whether at least one of the selected trace and traces adjacent to the selected trace has been changed as a result of correction of the pattern, and specifies, as a trace to be subjected to optimization of a trace pitch, the trace which has been determined to have been changed.

In the pattern correction apparatus, the trace pitch optimization section selects one trace from the corrected pattern, determines whether or not the pattern correction section has designated the selected trace as a trace to be subjected to optimization of a trace pitch, and optimizes a trace pitch of the trace designated as a trace to be subjected to optimization of a trace pitch.

The present invention provides a pattern optimization apparatus comprising:

a via count section for counting the number of vias in a pattern per unit area from graphics information about the pattern of an integrated circuit and requirements for a via area rate;

an extraction section for extracting the number of vias in a trace where vias are present and trace information in connection with an area where the via area rate has not been achieved;

a priority determination section for determining a priority at the time of correction of the via area rate; and an optimization section for optimizing the via area rate with reference to upper and lower limits of the via area rate.

In the pattern optimization apparatus, the extraction section sorts information about vias by the number of vias in accordance with the extracted number of vias and trace information; and the priority determination section determines the priority according to a relationship between the information about vias and the width of a trace.

In the pattern optimization apparatus, the pattern optimization apparatus determines vias to be corrected from a priority level determined by the priority determination section in accordance with the number of vias determined according to a rate of violation of the via area rate in a violation area determined by the via count section, and makes redundant or deletes the determined vias to be corrected and ascertains a via area rate after completion of correction of vias.

The present invention provides an integrated circuit design apparatus comprising:

an undetected node computing section for computing undetected nodes from a test pattern and a net list;

a graphics information extraction section for extracting graphics information for each classification of undetected nodes from the undetected nodes and graphics information about an integrated circuit;

a yield computing section for computing a yield for each classification of the undetected nodes from graphics information and deficiency intensity information about the extracted undetected nodes; and a market fraction defective computing section for computing a market fraction defective for each classification from the computed yield.

In the integrated circuit design apparatus, the classification is based on detected specifics of a degeneration failure.

The integrated circuit design apparatus further comprises:

a cell information computing section for computing, from the net list, cell information about cells connected to the undetected nodes, wherein the yield computing section computes the yield from graphics information about the undetected nodes, the deficiency density information, the cell information, and a failure depending on mask-pattern exposure of the cell.

The integrated circuit design apparatus further comprises a graphics information correction section for making a correction to graphics information about the integrated circuit.

The integrated circuit design apparatus further comprises a priority determination section for determining a priority of correction to graphics information to be corrected by the graphics information correction section.

The pattern correction apparatus of the present invention facilitates correction of a trace which is not present on trace grids. Further, the pattern optimization apparatus of the present invention can prevent a reduction in yields, which would otherwise be caused by denseness and nondenseness of vias. Moreover, the integrated circuit design apparatus of the present invention enables highly-accurate computation of a market fraction defective.

DESCRIPTION OF THE PREFERRED EMBODIMENTS

Embodiments of the present invention will be described hereunder by reference to the drawings.

First Embodiment

Figure 1:
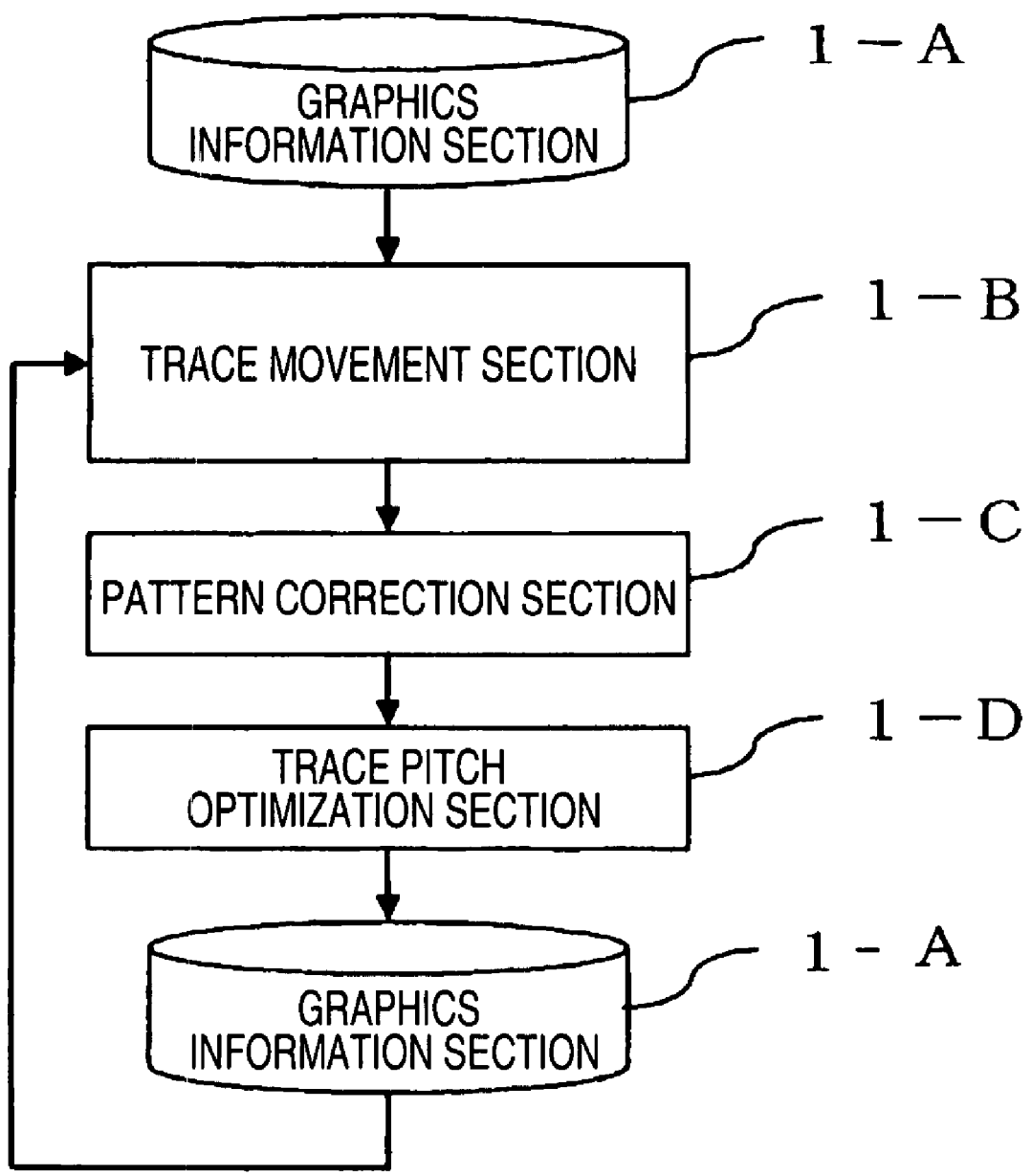
FIG. 1 is a block diagram showing an embodiment of a pattern correction apparatus of the present invention.

FIG. 1 is a block diagram showing an embodiment of a pattern correction apparatus of the present invention. As shown in FIG. 1, a pattern correction apparatus of the first embodiment comprises a graphic information storage section 1-A; a timing verification section (not shown); a trace movement section 1-B; a pattern correction section 1-C; and a trace pitch optimization section 1-D. The timing verification section, the trace movement section 1-B, the pattern correction section 1-C, and the trace pitch optimization section 1-D are realized as a result of a computer executing a program.

The graphics information storage section 1-A stores graphics information about a pattern of an integrated circuit. The pattern of the integrated circuit includes a plurality of traces. The graphics information employed in the present embodiment is information which shows the layout of traces in a pattern. In the present embodiment, horizontal traces provided in the integrated circuit and vertical traces provided in the same are provided in different trace layers, respectively. The horizontal traces and the vertical traces are connected together by means of vias (contacts).

The timing verification section subjects a pattern represented by the graphics information read from the graphics information storage section 1-A to timing verification. The trace movement section 1-B moves, among traces forming a pattern indicted by the graphics information read from the graphics information storage section 1-A, a trace which is not present on any trace grid to a position on a trace grid. From the pattern including the trace moved to the position on the trace grid, the trace movement section 1-B creates new graphics information (information about a graphics on a trace grid). The trace movement section 1-B stores the thus-created new graphics information into the graphics information storage section 1-A.

The pattern correction section 1-C makes a correction to a pattern by means of addition, deletion of a trace or changing the length of a trace, or the like. The pattern correction section 1-C creates graphics information about the corrected pattern by use of the new graphics information created by the trace movement section 1-B. The trace pitch optimization section 1-D optimizes a trace pitch by use of graphics information about the pattern corrected by the pattern correction section 1-C. The trace pitch optimization section 1-D stores the graphics information about the pattern whose trace pitch has been optimized into the graphics information storage section 1-A.

Figure 2:
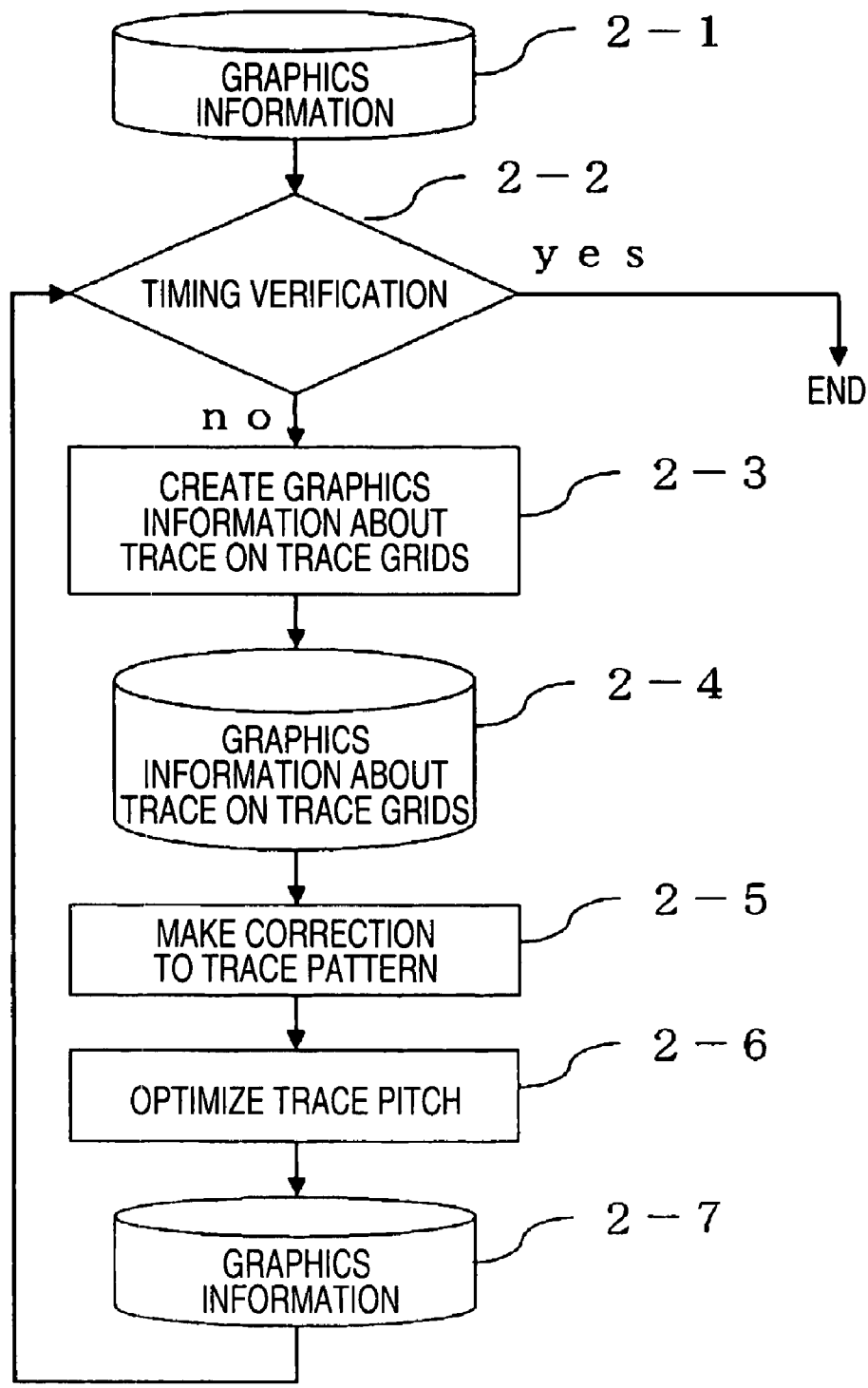
FIG. 2 is a flowchart showing operation of a pattern correction apparatus.

FIG. 2 is a flowchart showing operation of the pattern correction apparatus of the present embodiment. First, in step 2-2, the timing verification section subjects the graphics information read from the graphics information storage section 1-A to timing verification, to thus determine whether or not timing is violated. When violation of timing has not arisen, processing is completed. In contrast, when violation of timing has arisen, processing proceeds to step 2-3.

In step 2-3, the trace movement section 1-B moves, among the traces of the pattern represented by the graphics information read from the graphics information storage section 1-A, a trace—which is not present on trace grids—to a position on the trace grids, thereby creating new graphics information. In step 2-5, the pattern correction section 1-C corrects a pattern. The correction may also be performed by utilization of an automatic routing tool or through manual operation.

In step 2-6, the trace pitch optimization section 1-D optimizes the trace pitch of the pattern corrected in step 2-5. Processing returns to step 2-2 after completion of processing pertaining to step 2-6. Graphics information about the pattern whose trace pitch has been optimized is subjected to timing verification.

Figure 3:
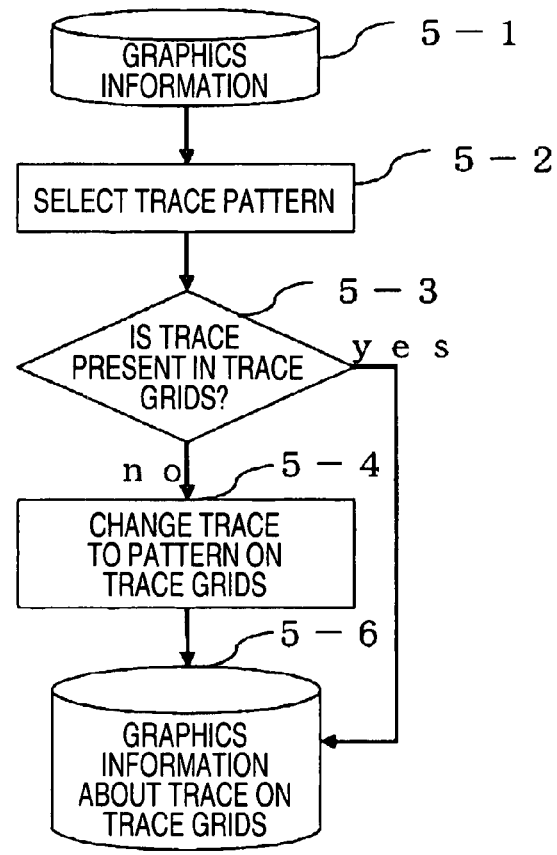
FIG. 3 is a flowchart showing details of processing pertaining to step 2-3 performed by the trace movement section 1-B.
Figure 4:
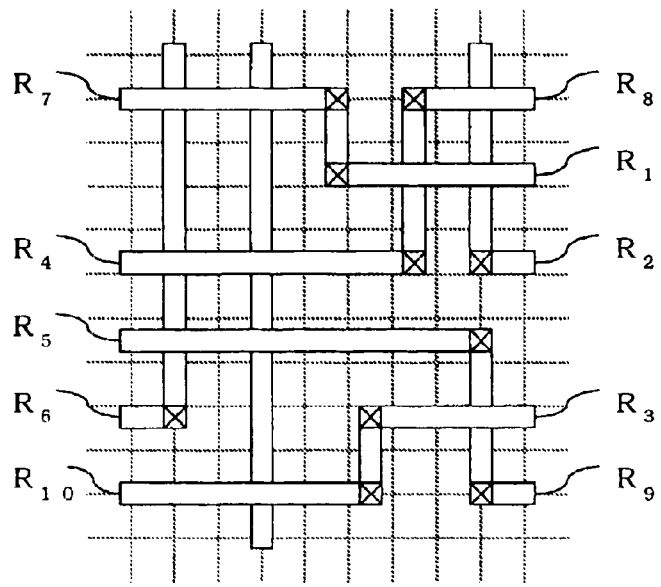
FIG. 4 is a view showing an example pattern achieved before a trace not located on trace grids is moved to a position above the trace grids.
Figure 5:
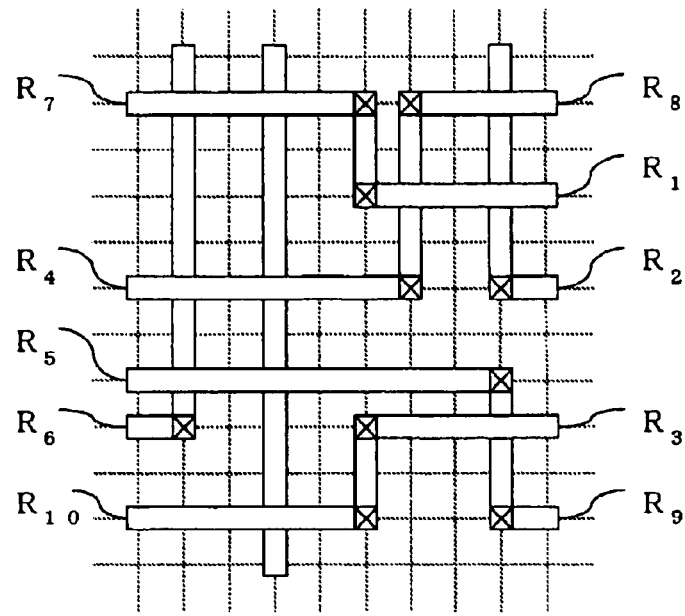
FIG. 5 is a view showing an example pattern achieved after a trace not located on trace grids has been moved to a position above the trace grids.
Figure 6:
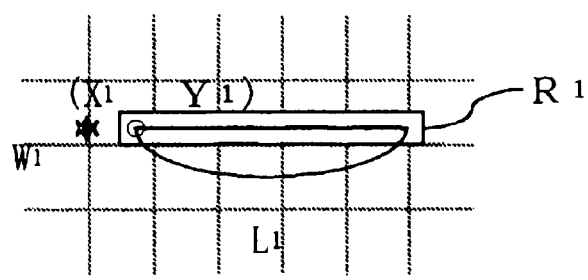
FIG. 6 is a view showing an example trace before being moved to a position above trace grids.
Figure 7:
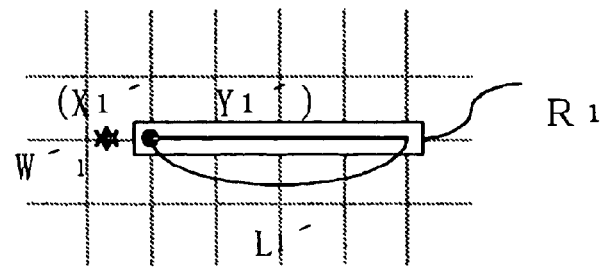
FIG. 7 is a view showing an example trace after having been moved to a position above trace grids.

Processing which is performed by the trace movement section 1-B and pertains to step 2-3 will be described in detail hereunder. FIG. 3 is a flowchart showing details of processing which is performed by the trace movement section 1-B and pertains to step 2-3. FIG. 4 is an example pattern acquired before a trace which is not present on trace grids is moved to a position on trace grids. FIG. 5 is a view showing an example pattern achieved after movement of the trace—which is not present on trace grids—to a position above trace grids. FIG. 6 is a view showing an example trace achieved before being moved to a position on trace grids. FIG. 7 is a view showing an example trace achieved after having been moved to a position on a trace grid.

As shown in FIG. 3, the trace movement section 1-B selects one trace from a pattern in relation to the integrated circuit determined to have caused violation of timing by the timing verification section (step 5-2). In step 5-2, the trace movement section 1-B selects a trace having a long trace length, a trace belonging to a critical net, or an arbitrary trace. Next, the trace movement section 1-B determines whether or not the selected trace is present at a position on trace grids (step 5-3). Processing proceeds to step 5-4 in relation to a trace which is not present on trace grids, where the trace is moved to a position above trace grids. Traces located on the trace grids are subjected to nothing.

The trace movement section 1-B subjects respective traces in the pattern to above processing. For instance, a trace R1 in a pattern shown in FIG. 4 is not present on any trace grids. Hence, as shown in FIGS. 6 and 7, the trace movement section 1-B translates the trace R1 to trace grids in the neighborhood. Consequently, the pattern shown in FIG. 4 turns into a pattern shown in FIG. 5.

Figure 8:
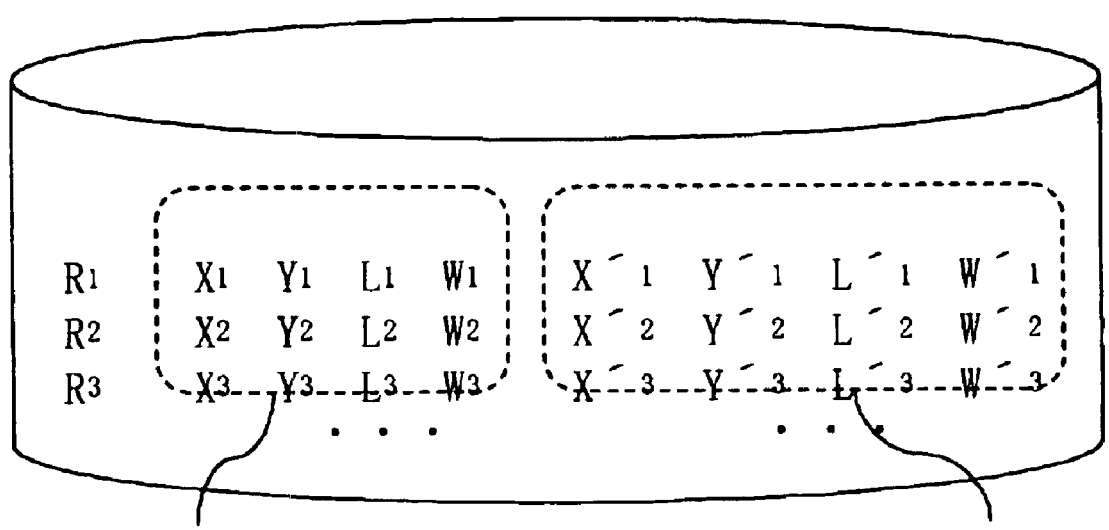
FIG. 8 is a view showing a storage section for storing graphics information about a pattern of an integrated circuit and graphics information newly created by the trace movement section 1-B.

The position of each of the traces is specified by starting points (X, Y), a length (L), and a width (W). The trace R1 shown in FIG. 6 is specified by staring points (X1, Y1), a length L1, and a width W1. As a result of the trace R1 being moved to the position above the trace grids, the trace R1 is specified by starting points (X1', Y1'), a length L1', and a width W1'. Graphics information includes starting points (X, Y), a length (L), and a width (W) of each of the traces forming a pattern. FIG. 8 is a view showing the graphics information storage section 1-A that stores, in an associated manner, graphics information about the pattern of the integrated circuit and the graphics information newly created by the trace movement section 1-B.

Figure 9:
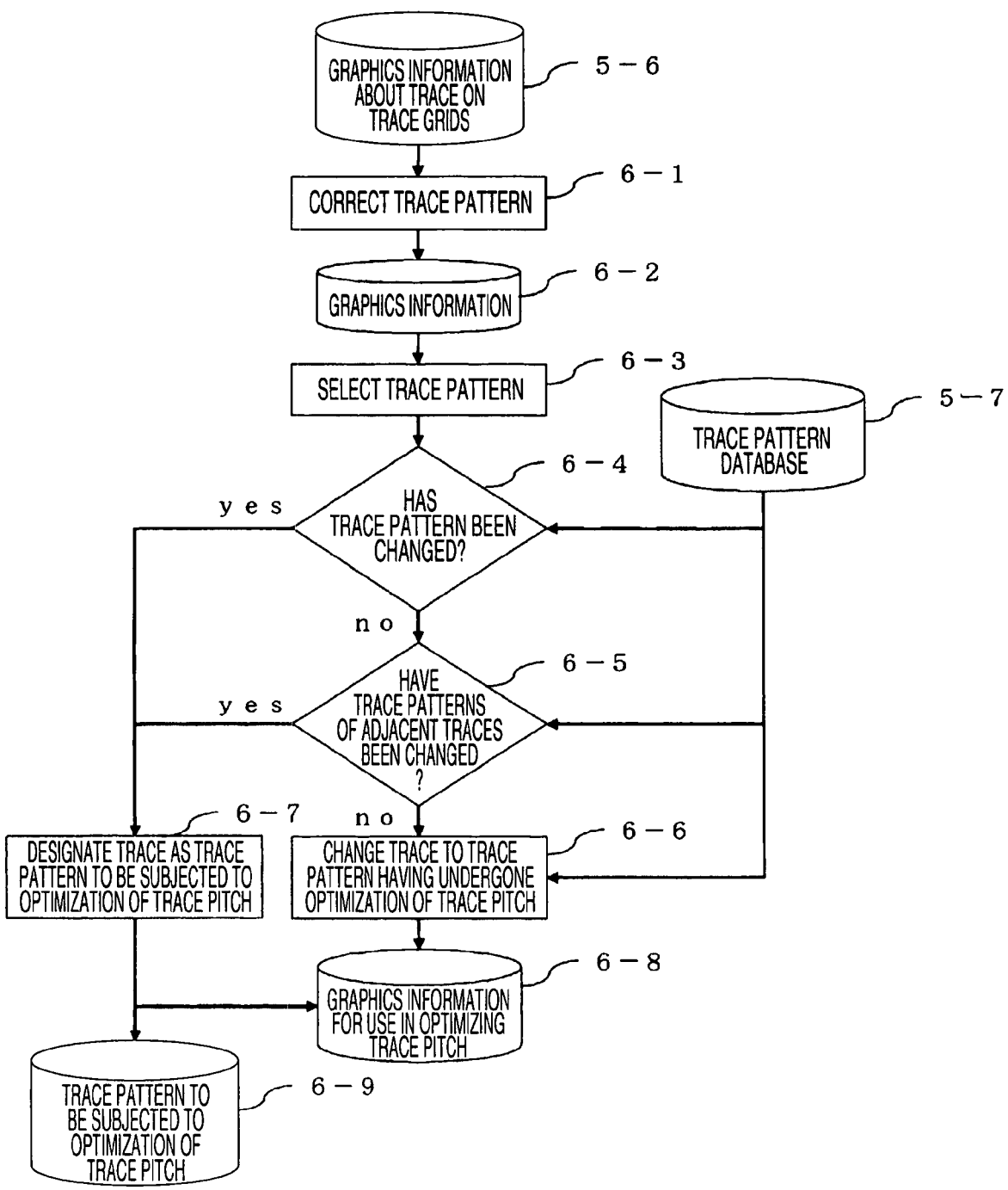
FIG. 9 is a flowchart showing details of processing pertaining to step 2-5 performed by a pattern correction section 1-C.

Details of processing pertaining to step 2-5 performed by the pattern correction section 1-C will now be described. FIG. 9 is a flowchart showing details of processing pertaining to step 2-5 performed by the pattern correction section 1-C. As shown in FIG. 9, the pattern correction section 1-C makes a correction to a pattern, thereby creating graphics information about the corrected pattern (step 6-1). Next, the pattern correction section 1-C selects one from the traces in the corrected pattern (step 6-3). The pattern correction section 1-C determines whether or not the selected trace has been changed by means of the correction made in step 6-1 (step 6-4). Further, the pattern correction section 1-C determines whether or not a trace adjacent to the selected trace has been changed by means of correction of the pattern (step 6-5). Determinations pertaining in steps 6-4 and 6-5 are made by means of comparing graphics information created after correction of the pattern with the graphics information newly created before correction of the pattern.

When the trace is determined to have been changed in at least either step 6-4 or 6-5 by means of correction of the pattern, the pattern correction section 1-C determines this trace as a trace to be subjected to optimization of a trace pitch (step 6-7). Meanwhile, when the trace is determined not to have been changed in both steps 64 and 6-5, the pattern correction section 1-C returns this trace to a position determined from the graphics information which has been achieved before correction of the pattern and movement of the trace to a position above the trace grids (step 6-6).

Figure 10:
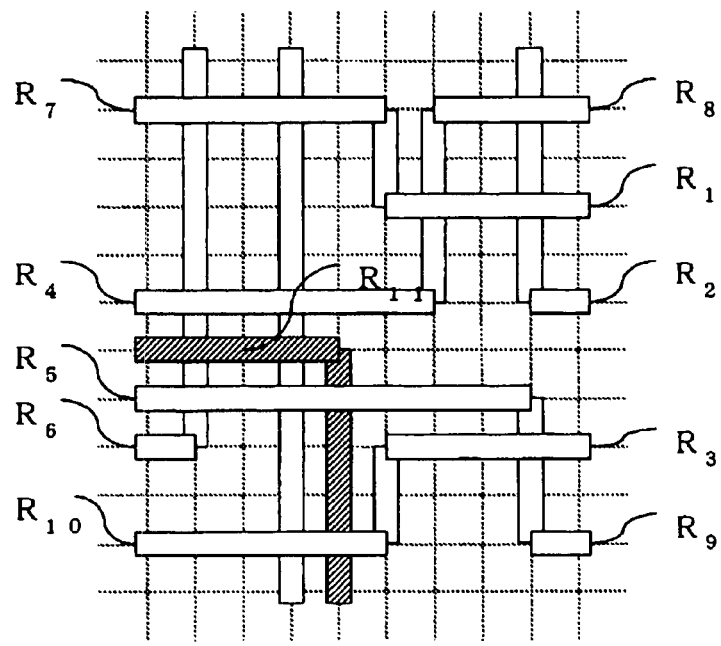
FIG. 10 is a view showing an example pattern formed by addition of a trace R11 to the pattern shown in FIG. 5.

The pattern correction section 1-C subjects the respective traces in the pattern to above processing. FIG. 10 is a view showing an example pattern created by addition of a trace R11 to the pattern shown in FIG. 5. Vias are omitted from FIG. 10. As shown in FIG. 10, after having made a correction in order to add a new trace R11 to the pattern, the pattern correction section 1-C creates graphics information about the thus-corrected pattern. The pattern correction section 1-C selects respective traces from the corrected pattern, and performs processing pertaining to steps 6-4 to 6-7.

Figure 11:
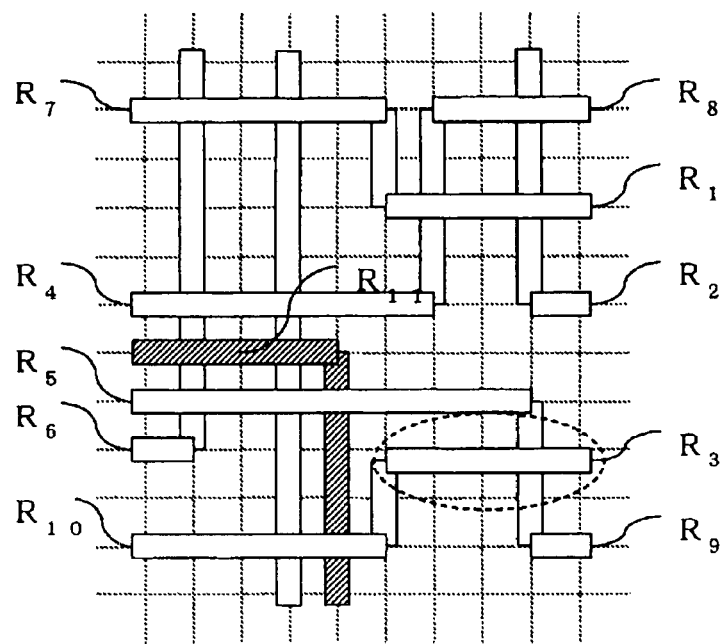
FIG. 11 is a view showing a pattern acquired as a result of a trace R3 having undergone processing pertaining to step 2-5.

There will now be described processing performed when the pattern correction section 1-C has selected a trace R3 from the pattern shown in FIG. 10. In step 6-4, the pattern correction section 1-C determines, from a value Y showing the longitudinal position of the starting point of the trace R3, whether or not a change has been made to the trace R3. Moreover, in step 6-5, the pattern correction section 1-C determines, from values Y of respective starting points of traces R5 and R9 adjacent to the trace R3, whether or not a change has been made to the trace R3. Since the trace R3 is determined to be unchanged in steps 64 and 6-5, the pattern correction section 1-C returns the trace R3 to a position Y3 determined from graphics information which is achieved before correction of the pattern and movement of the trace to a position on the trace grids. FIG. 11 is a view showing a pattern of a result achieved after the trace R3 has undergone processing pertaining to step 2-5.

Figure 12:
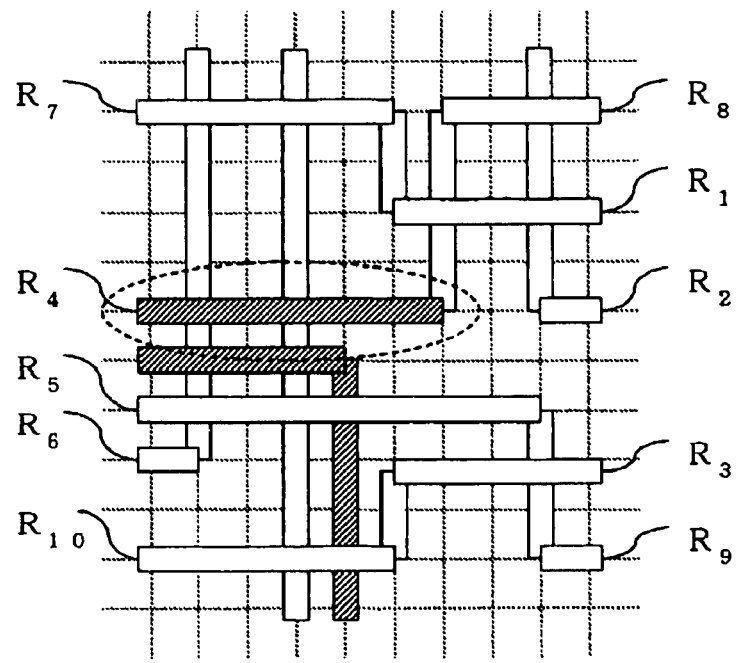
FIG. 12 is a view showing a pattern acquired as a result of a trace R4 having undergone processing pertaining to step 2-5.

There will now be described processing performed when the pattern correction section 1-C has selected a trace R4 from the pattern shown in FIG. 10. In step 6-4, the pattern correction section 1-C determines whether or not the trace R4 has been changed. In step 6-5, a determination is made as to whether or not a change has been made to a trace R11 adjacent to the trace R4. In relation to the trace R4, the position of the adjacent trace R11 is determined to have been changed in step 6-5, and hence the pattern correction section 1-C specifies the trace R4 as an object of trace-pitch optimization. When the trace R4 has been designated as an object of trace-pitch optimization, the position of this trace is not moved. FIG. 12 is a view showing a pattern of a result achieved after the trace R4 has undergone processing pertaining to step 2-5.

There will be described processing performed when the pattern correction section 1-C has selected the trace R11 from the pattern shown in FIG. 10. In step 6-4, the pattern correction section 1-C determines whether or not a correction has been made to the trace R11. In relation to the trace R11 added at the time of correction of the pattern, the position of the adjacent trace R11 is determined to have been changed in-step 6-4, and hence the pattern correction section 1-C specifies the trace R11 as an object of trace-pitch optimization.

Figure 13:
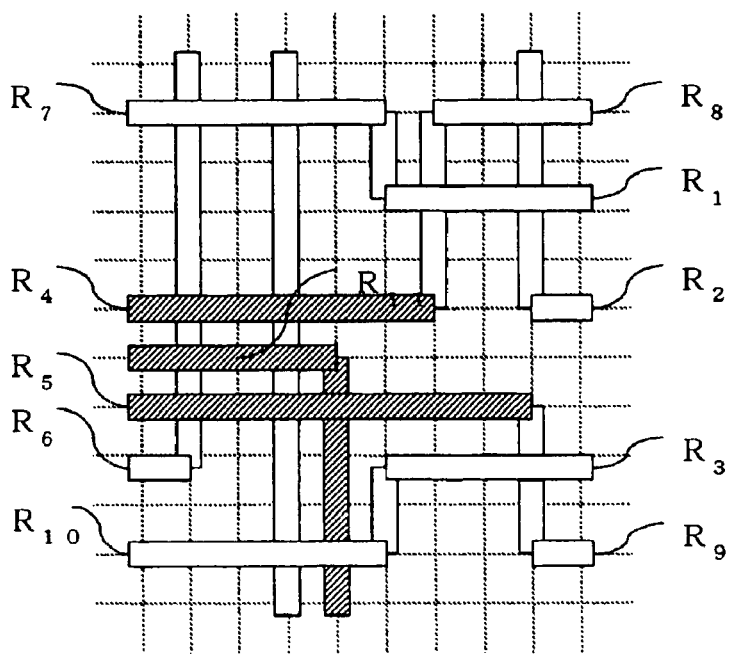
FIG. 13 is a view showing a pattern acquired as a result of all horizontal traces having undergone processing pertaining to step 2-5.
Figure 14:
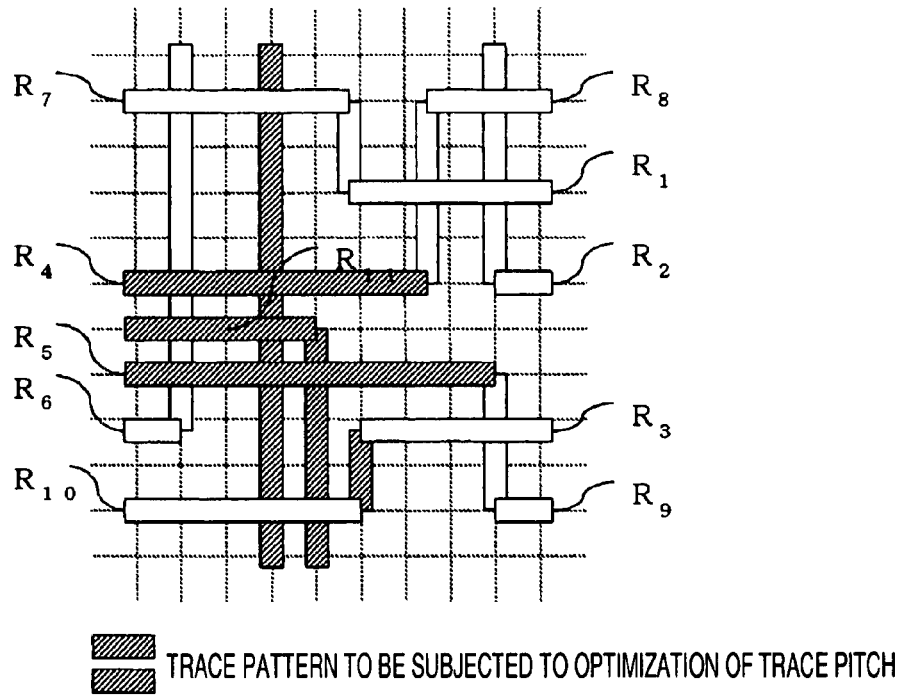
FIG. 14 is a view showing a pattern acquired as a result of all traces having undergone processing pertaining to step 2-5.

As mentioned above, the pattern correction section 1-C subjects all traces in the pattern to processing mentioned above. FIG. 13 is a view showing a pattern of a result achieved after all of the horizontal traces have undergone processing pertaining to step 2-5. FIG. 14 is a view showing a pattern of a result achieved after all of the traces has undergone processing pertaining to step 2-5. According to processing performed by the pattern correction section 1-C, the number of processing steps can be curtailed by means of designating a trace which is an object of trace-pitch optimization. Further, fluctuations in timing resulting from optimization of a trace pitch can be reduced.

Figure 15:
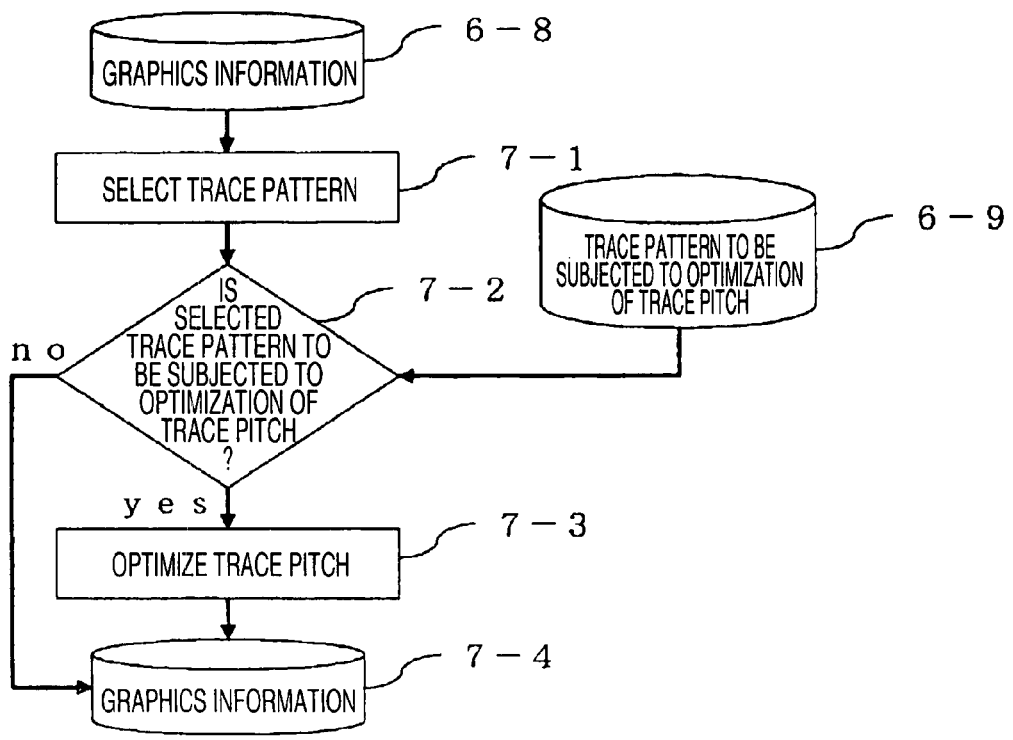
FIG. 15 is a flowchart showing details of processing pertaining to step 2-6 performed by a trace pitch optimization section 1-D.

Next, details of processing pertaining to step 2-6 performed by the trace pitch optimization section 1-D will be described. FIG. 15 is a flowchart showing details of processing pertaining to step 2-6 performed by the trace pitch optimization section 1-D. As shown in FIG. 15, the trace pitch optimization section 1-D selects one from the pattern corrected by the pattern correction section 1-C (step 7-1). The trace pitch optimization section 1-D determines whether or not the selected trace is an object of trace-pitch optimization (step 7-2). The trace pitch optimization section 1-D optimizes a trace pitch in connection with the object of trace-pitch optimization (step 7-3).

Figure 16:
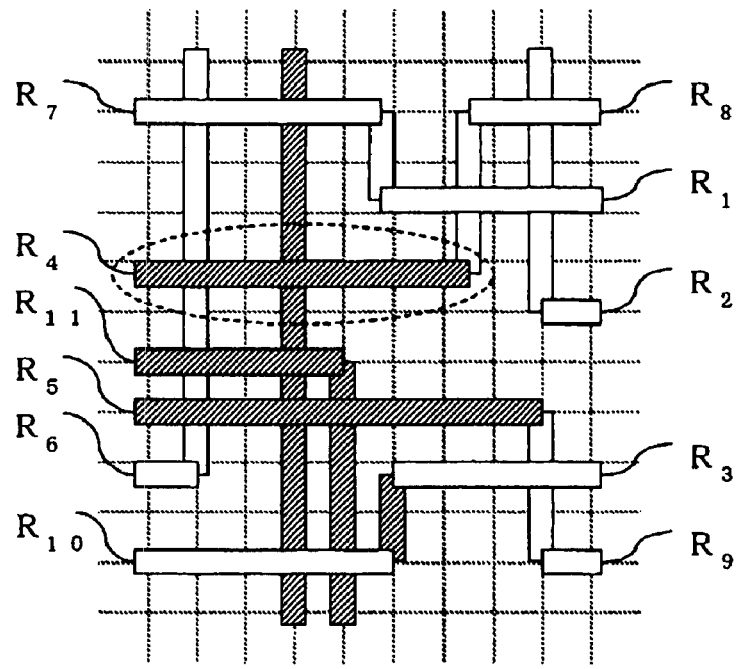
FIG. 16 is a view showing a pattern acquired as a result of a trace R4 having undergone processing pertaining to step 2-6.

The trace pitch optimization section 1-D subjects respective traces in the pattern to previously-mentioned processing. When the trace R1 has been selected in step 7-1, the trace R11 is not an object of trace pitch optimization, and hence the trace pitch is not optimized. Meanwhile, when the trace R4 is selected in step 7-1, the trace R4 is an object of trace-pitch optimization, and hence a trace pitch is optimized. FIG. 16 is a view showing a pattern of a result achieved after the trace R4 has undergone processing pertaining to step 2-6.

Figure 17:
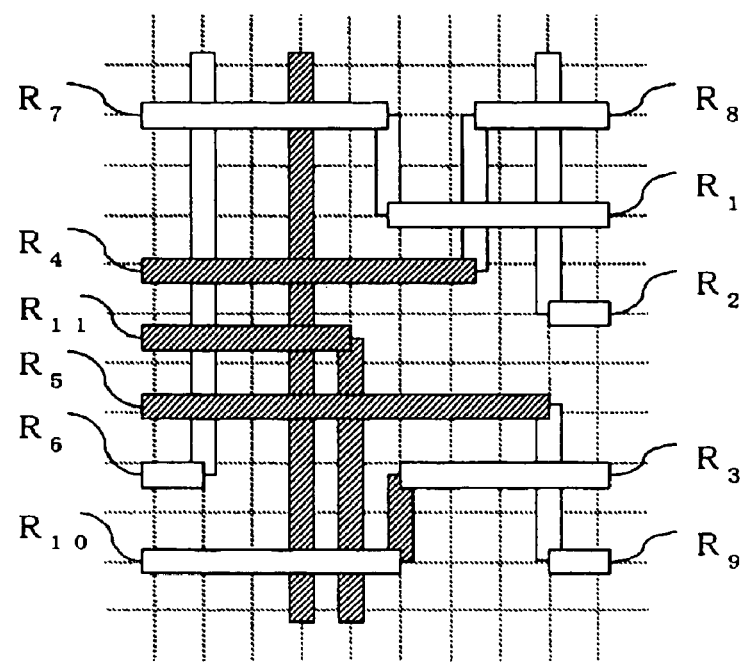
FIG. 17 is a view showing a pattern acquired as a result of all horizontal traces having undergone processing pertaining to step 2-6.
Figure 18:
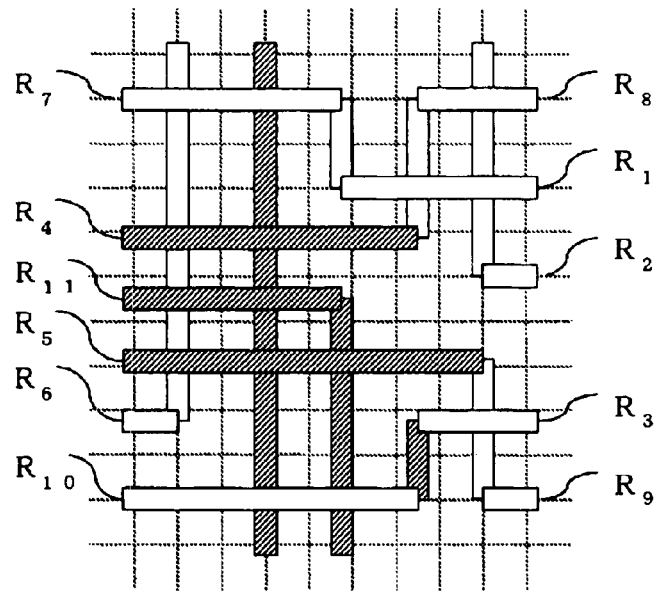
FIG. 18 is a view showing a pattern acquired as a result of all traces having undergone processing pertaining to step 2-6.

As mentioned above, the trace pitch optimization section 1-D subjects all of the traces in the pattern to previously-described processing. FIG. 17 is a view showing a pattern of a result achieved after all of the horizontal traces have undergone processing pertaining to step 2-6. FIG. 18 is a view showing a pattern of a result achieved after all of the traces have undergone processing pertaining to step 2-6. In passing, a trace which is responsible for a reduction in yields computed from process parameters can also be specified as an object of trace-pitch optimization, and yields can be enhanced efficiently. This is very useful when yields are desired to be enhanced with minor trace fluctuations.

As described above, according to the pattern correction apparatus of the present embodiment, a pattern of an integrated circuit can be changed as many times as it is desired by means of repeatedly performing procedures for placing a trace—which is not located above trace grids—at a position on trace grids, to thus optimize a trace pitch. Moreover, an automatic routing tool readily optimizes a trace pitch by means of placing a trace—which is not located above trace grids—at a position on trace grids.

Second Embodiment

Figure 19:
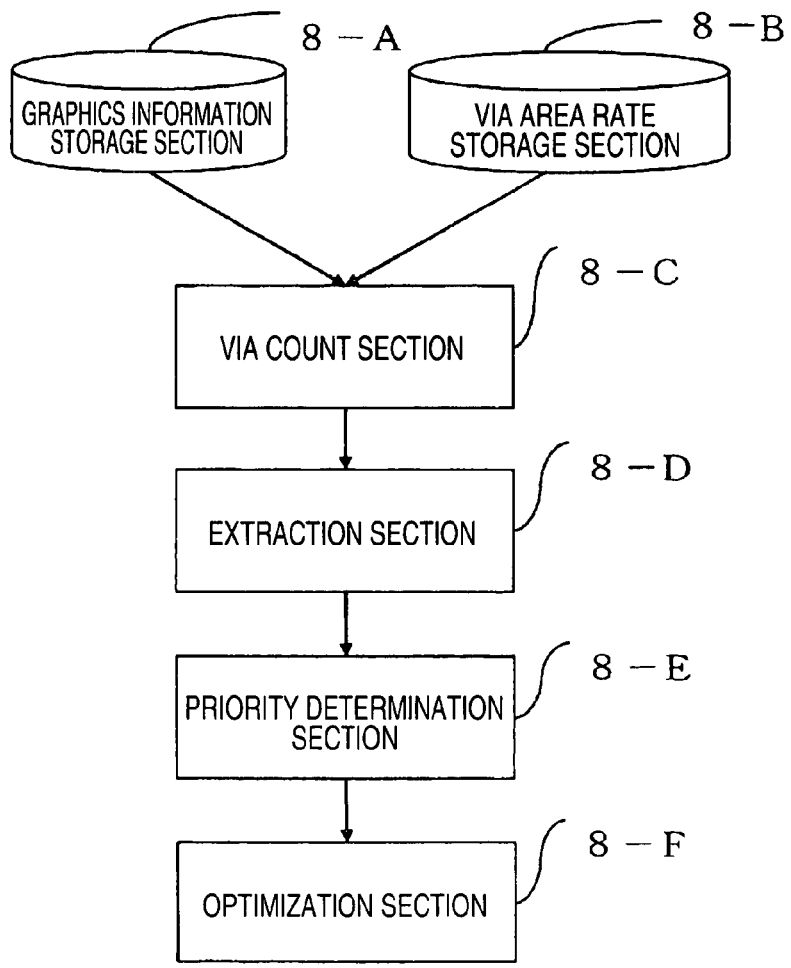
FIG. 19 is a block diagram showing an embodiment of a pattern optimization apparatus of the present invention.

FIG. 19 is a block diagram showing an embodiment of a patter optimization apparatus of the present invention. As shown in FIG. 19, the pattern optimization apparatus of the second embodiment has a graphics information storage section 8-A; a via area rate storage section 8-B; a via count section 8-C; an extraction section 8-D; a priority determination section 8-E; and an optimization section 8-F. The via count section 8-C, the extraction section 8-D, the priority determination section 8-E, and the optimization section 8-F are embodied by means of a computer executing a program.

The graphics information storage section 8-A stores graphics information about a pattern of an integrated circuit. The graphics information of the present embodiment is information showing positions of vias for use in connecting together traces and trace layers of a pattern having finished undergone routing. The via area rate storage section 8-B stores via area rate information which specifies the upper and lower limits of an area occupied by vias per unit area. The via count section 8-C computes the rate of an area occupied by vias per unit area. The extraction section 8-D extracts the number of vias and information about a trace. The priority determination section 8-E determines a priority assigned when a correction is made to the via area rate. The optimization section 8-F optimizes the via area rate.

Figure 20:
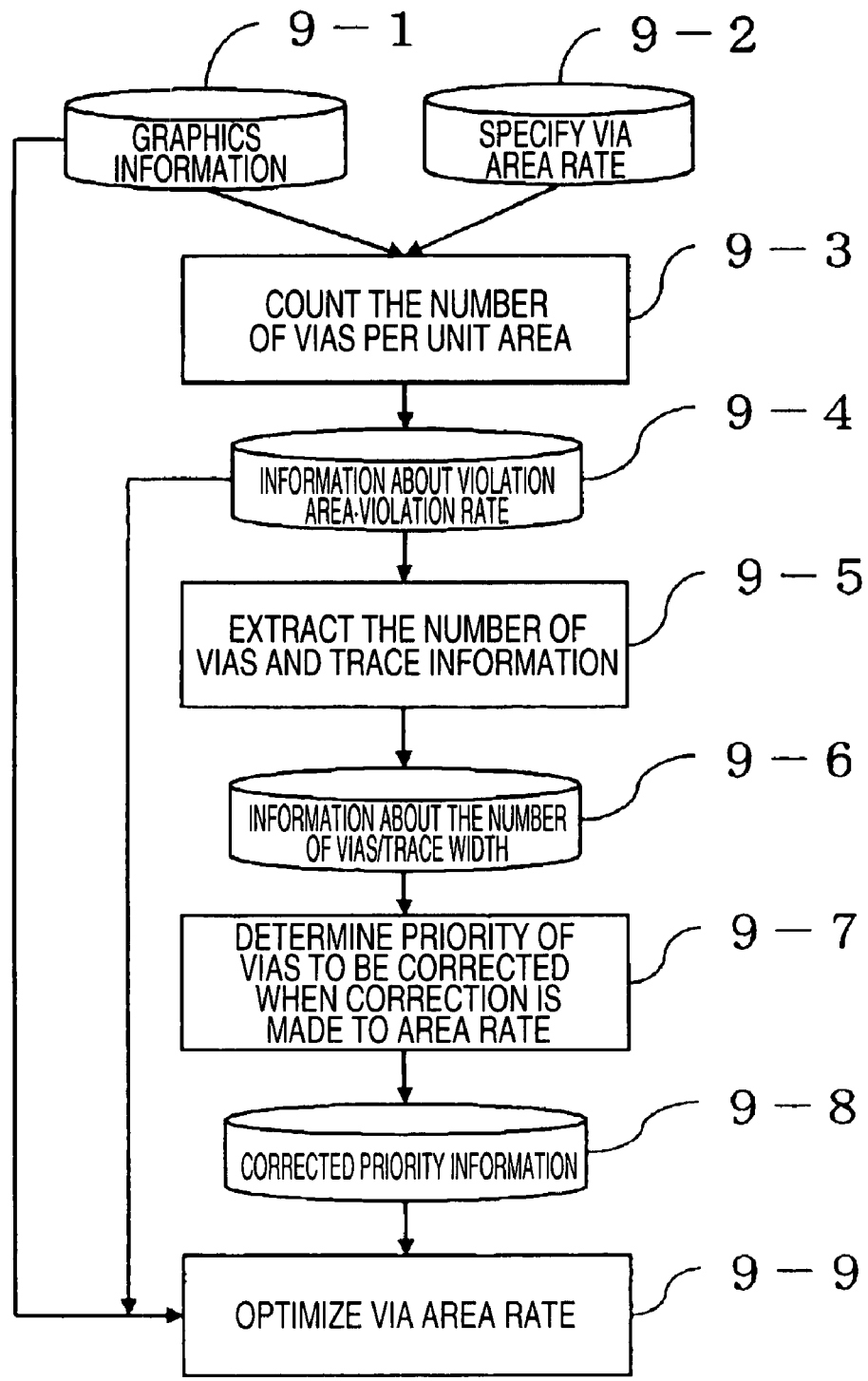
FIG. 20 is a flowchart showing operation of the pattern optimization apparatus.

FIG. 20 is a flowchart showing operation of the pattern optimization apparatus of the present embodiment. First, in step 9-3, the via count section 8-C determines a unit area—which is defined by means of a via area rate—as an area ascertainment target frame from graphics information. The number of vias generated in the ascertainment target frame is counted, thereby ascertaining whether or not a total number of vias fall within the upper limit via value and the lower limit via value. When a specified value is violated after ascertainment, information about that target frame (upper right coordinates and lower left coordinates of the frame) and the rate of violation are stored into an area rate violation region database into which the information and the rate of violation are to be stored. The ascertainment target frame is moved stepwise to a certain overlapping extent in the vertical and horizontal directions such that ascertainment of boundaries of the ascertainment target frame is not overlooked.

Next, in step 9-5, the extraction section 8-D makes a reference to the area rate violation region database. In relation to vias which are present in a violation target region, a relationship between the width of a trace in a different layer where the vias are formed and the number of vias is stored in the database. In step 9-7, the priority determination section 8-E makes a reference to the database that shows the relationship between the width of a trace and the number of visas. When the via area rate is optimized, the priority of via correction is determined in order to correct an area rate without decreasing yields, and a result of determination is stored in via sequence-of-correction information database. Next, in step 9-9, the optimization section 8-F selects, from the via correction priority level information database, vias to be corrected in accordance with the priority of correction, and makes a correction to the via area rate in order to fulfill the via area rate.

Figure 21:
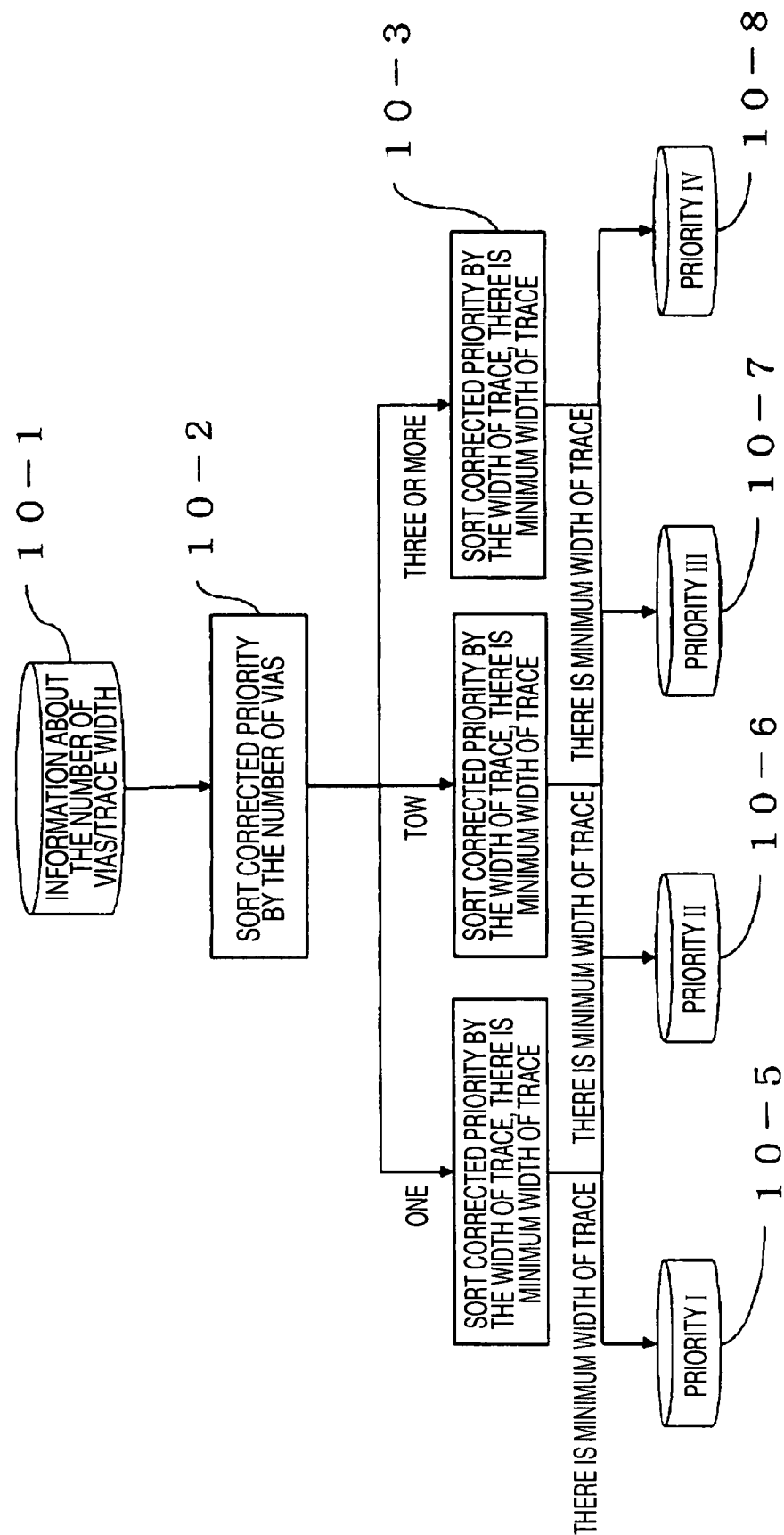
FIG. 21 is a flowchart showing details of processing pertaining to step 9-7 performed by a priority determination section 8-E.

Details of processing pertaining to step 9-7 performed by the priority determination section 8-E will be described. FIG. 21 is a flowchart showing details of processing pertaining to step 9-7 performed by the priority determination section 8-E. As shown in FIG. 21, the priority determination section 8-E determines priorities of correction according to the number of generated vias (step 10-2). The reason why the priorities of correction are determined according to the number of vias is that priorities of correction are determined in consideration of a via-disappearance phenomenon in which vias disappear at the stage of manufacture as the number of vias increases. In the example shown in FIG. 21, information is classified in step 10-2 in such a way that the number of vias becomes one, two, three, and more. By means of classification of information, priorities of correction can be determined in consideration of prevention of the via-disappearance phenomenon.

The priority determination section 8-E further determines priorities of correction according to the width of the trace into which vias are created (step 10-3). The reason why priorities are classified according to the width of a trace is that priorities of correction are determined in consideration of the degree of difficulty in creating vias changing according to the width of a trace. In the example shown in FIG. 21, a criterion for a trace where vias are formed is defined as a trace having the minimum width specified by a design rule. This criterion is defined on the assumption that the via area rate has violated the lower limit. When the via area rate has violated the upper limit, this criterion is changed. Processing pertaining to determination step 10-3 is performed, so that determination of priorities taking into account the width of a trace is enabled.

Above-described processing is performed, so that priorities of a correction to vias taking into account production yields and facilitation of production can be achieved.

Figure 22:
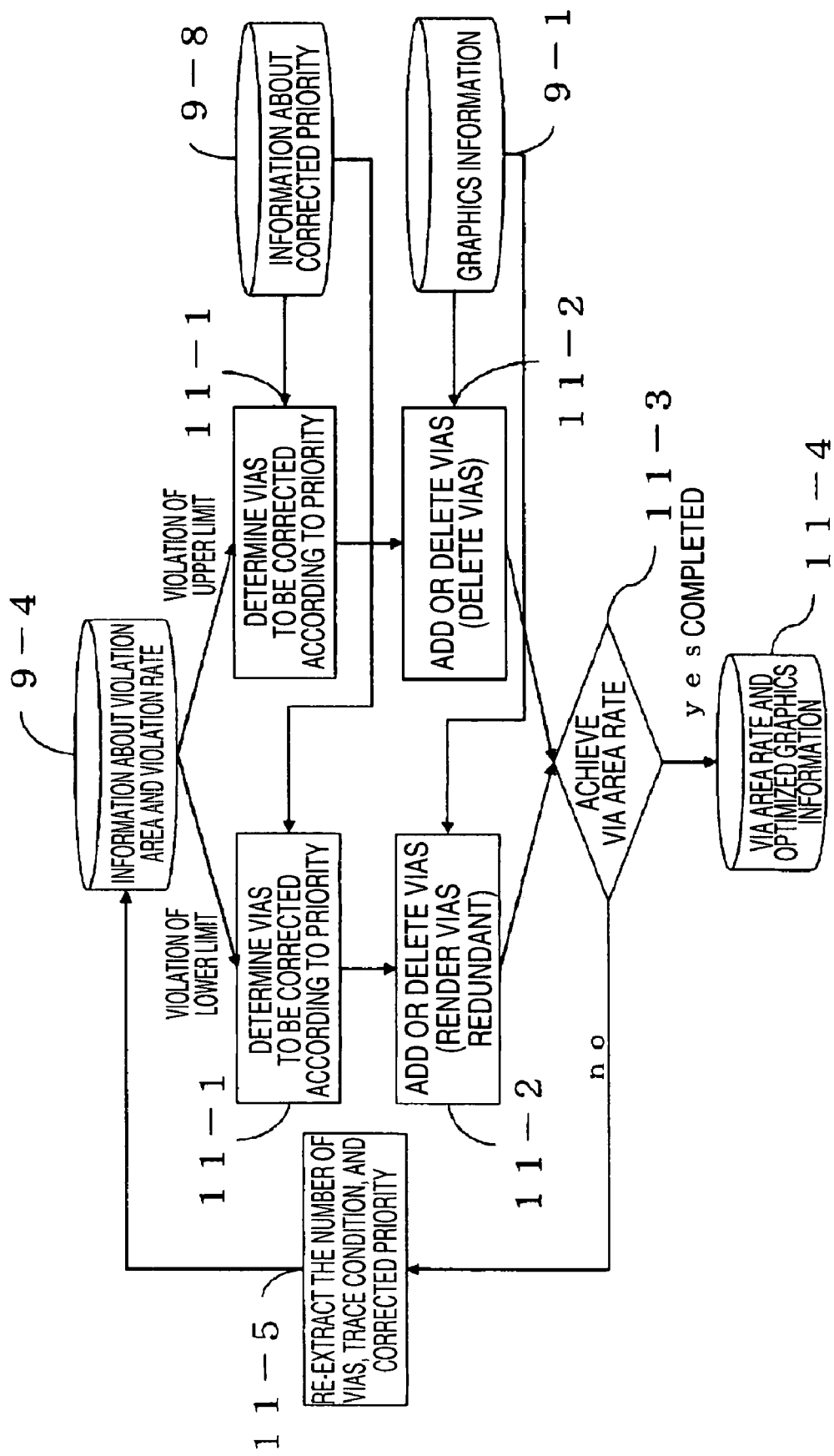
FIG. 22 is a flowchart showing details of processing pertaining to step 9-9 performed by an optimization section 8-F.

Details of processing pertaining to step 9-9 performed by the optimization section 8-F will now be described. FIG. 22 is a flowchart showing details of processing pertaining to step 9-9 performed by the optimization section 8-F. As shown in FIG. 22, the optimization section 8-F determines vias to be corrected in accordance with the via area rate violation region, violate rate information, and corrected priority level information and in response to the correction priority level (step 11-1). For instance, when the via area rate has violated the lower limit value, the via area rate is classified into a priority level I (10-5) shown in FIG. 21 in step 11-1 where vias to be corrected are determined, and vias to be corrected are determined. When the vias to be corrected are determined to be insufficient at the priority level I, vias to be corrected are assigned in sequence of, e.g., a priority level II (10-6) and a priority level III (10-7). Likewise, when the via area rate has violated the upper limit value, vias to be corrected are determined by reference to the correction priority level information.

Next, the optimization section 8-F adds or deletes vias to the vias determined to be corrected (step 11-2). For instance, when the lower limit of the via area rate is violated, vias determined to be corrected are subjected to redundancy processing. Vias determined to be corrected are repeatedly subjected to this processing, whereby an increase in the number of vias and enhancement of an area rate are achieved. Moreover, since vias to be corrected are determined according to the priority of correction, enhancement of yields is achieved as a result of vias becoming redundant. Conversely, when the via area rate has exceeded the upper limit, vias determined to be corrected are deleted.

Next, the optimization section 8-F ascertains the via area rate (step 11-3). When the via area rate is fulfilled, optimization processing is terminated, and graphics data are stored (step 11-4). When the via area rate is not fulfilled, processing proceeds to step 11-5 where the number of vias, trace information, and the priority of correction are re-extracted. Vias and trace information, which are achieved after optimization processing has been reperformed, are re-extracted.

The number of vias to be corrected and the priority of correction have been determined in advance through above processing, whereby a via area rate which involves less reversion of processing and takes into account designed yields can be optimized.

As mentioned previously, the pattern optimization apparatus of the present embodiment computes a via area rate; determines, in connection with vias which are present in a violation area, the priority of correction pertaining to yields from a result of extraction of the number of vias and trace information; and adds (makes vias redundant) or subtracts vias neither too much nor too little according to the priority, thereby automatically correcting the via area rate.

Third Embodiment

Figure 23:
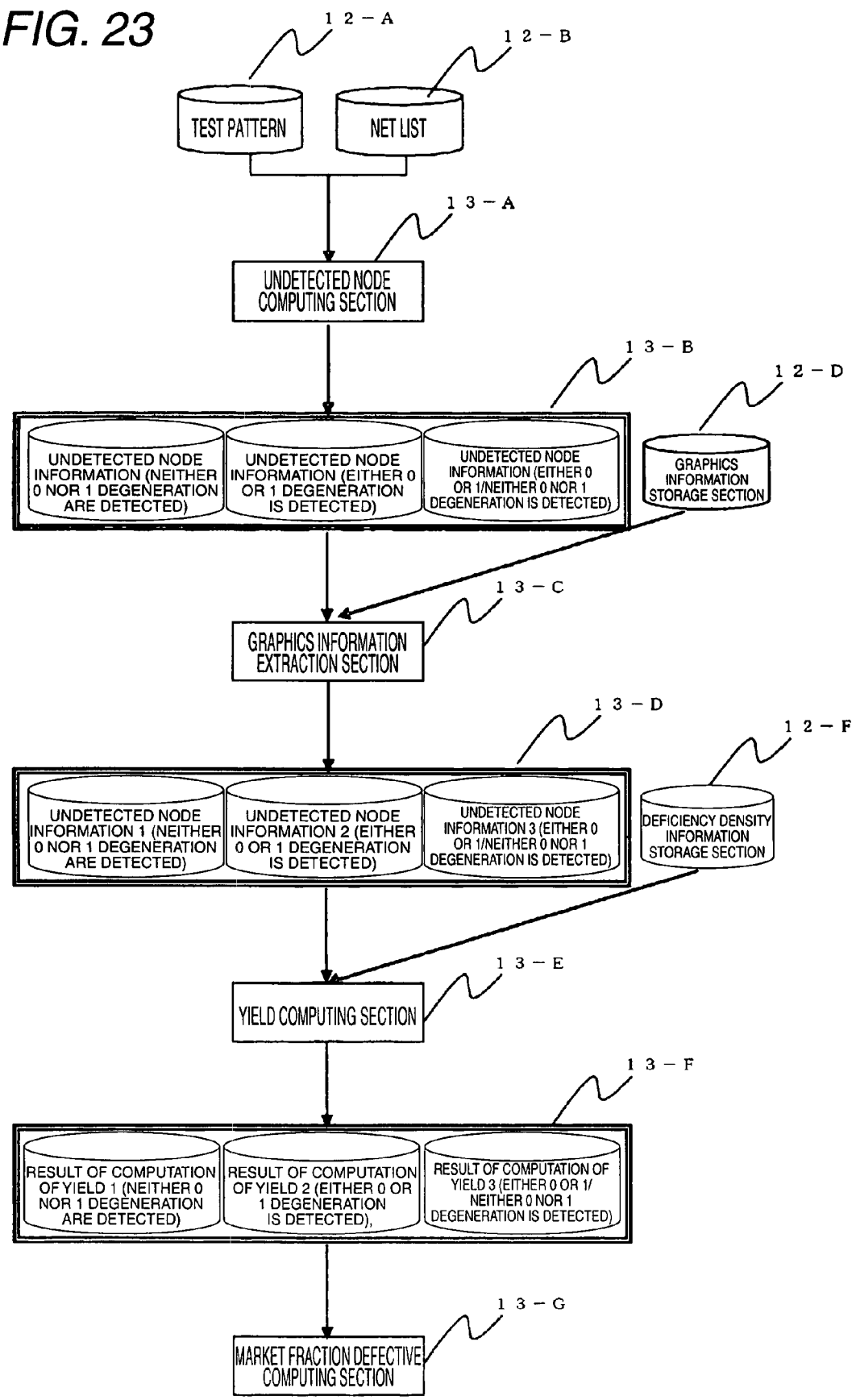
FIG. 23 is a block diagram showing an embodiment of an integrated circuit design apparatus of the present invention.

FIG. 23 is a block diagram showing an embodiment of an integrated circuit design apparatus of the present invention. As shown in FIG. 23, the integrated circuit design apparatus of the present invention comprises a test pattern storage section 12-A; a net list storage section 12-B; an undetected node computing section 13-A; a graphics information extraction section 13-C; a yield computing section 13-E; and a market fraction defective computing section 13-G. The undetected node computing section 13-A, the graphics information extraction section 13-C, the yield computing section 13-E, and the market fraction defective computing section 13-G are realized by means of the computer executing a program.

The undetected node computing section 13-A reads a test pattern from the test pattern storage section 12-A and a net list from the net list storage section 12-B; and computes nodes which are undetected for reasons of a degeneration failure. Information about the computed, undetected nodes is recorded as undetected node information 13-B according to classifications determined on the basis of the nature of a detected degeneration failure. In the present embodiment, the information is classified as the undetected node information 13-B into three types of categories: namely, undetected node information 1 (neither degeneration 0 nor degeneration 1 is detected), undetected node information 2 (either degeneration 0 or degeneration 1 is undetected), and undetected node information 3 (either one or both of degeneration 0 and degeneration 1 are undetected).

Figure 24:
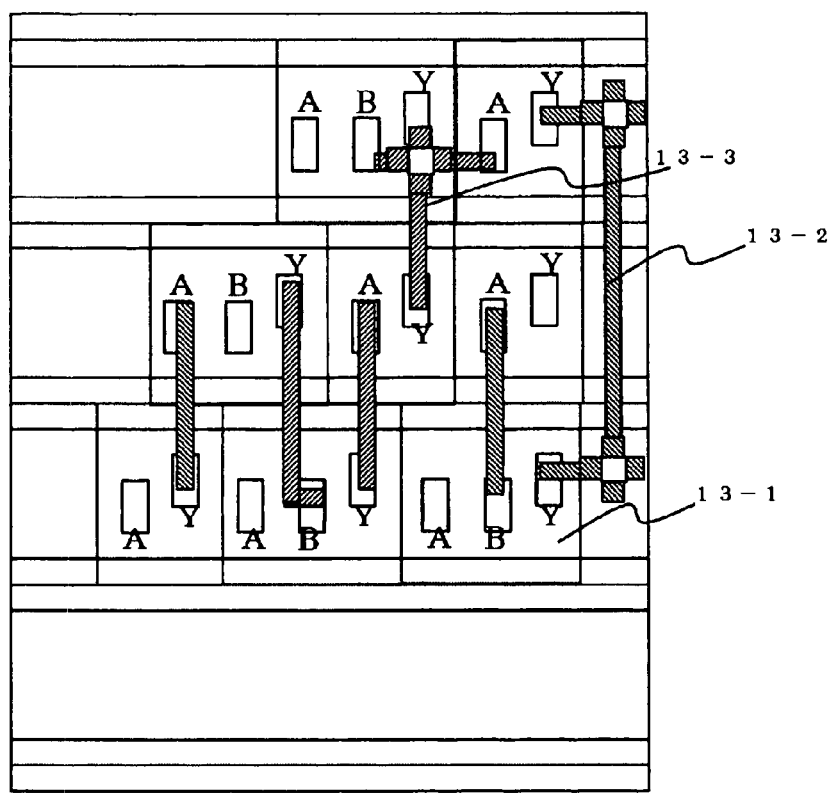
FIG. 24 is example graphics information about the integrated circuit.
Figure 25:
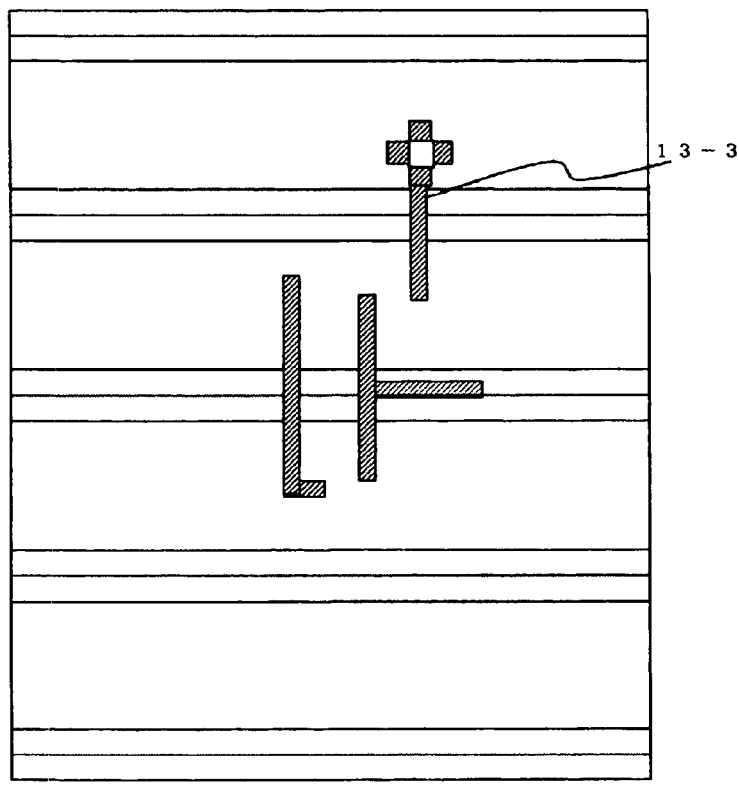
FIG. 25 is a view showing graphics information about undetected nodes extracted from the graphics information shown in FIG. 24.

The graphics information extraction section 13-C extracts, from the graphics information storage section 12-D, undetected node graphics information corresponding to each of pieces of undetected node information. FIG. 24 is a view showing example graphics information about an integrated circuit. FIG. 24 shows a case where trace information 13-2 about a detected node and trace information 13-3 about an undetected node are included in a trace for standard cell information 13-1. The graphics information shown in FIG. 24 is stored in the graphics information storage section 8-A. FIG. 25 is a view showing an example result of extraction performed by the graphics information extraction section 13-C. FIG. 25 is a view showing graphics information about undetected nodes extracted from the graphics information shown in FIG. 24. As mentioned above, the graphics information extraction section 13-C extracts only information about a trace of undetected nodes (undetected node graphics information). Extracted, undetected node graphics information 13-D is classified according to the nature of a detected failure and recorded.

The yield computing section 13-E reads deficiency density information, such as process parameters, or the like, from a deficiency density information storage section 12-F; and computes a yield for each classification of undetected nodes. The thus-computed yield is also recorded under similar classifications.

The market fraction defective computing section 13-G computes a market fraction defective from the yield computed by the yield computing section 13-E. In general, since a market fraction defective can be determined by an expression "Market fraction defective=1−yield," computing a market fraction defective from a yield is easy. However, simple use of the expression "Market fraction defective=1−yield" sometimes leads to a market fraction defective which is greater than an actual market fraction defective. In such a case, it is better to subject a degeneration failure to weighting on the basis of the fact that the undetected node graphics information and the yields computed by the yield computing section are classified according to the nature of a detected degeneration failure, and by utilization of trace/via-related process parameter individual yield information, such as a short-circuit failure/an open failure, or the like, obtained through computation of a yield from deficiency density information. Specifically, there is performed weighting taking into account classification of failures (a failure of a short-circuit between traces, an open failure of traces, or the like), detection of either 0 or 1 of a degeneration failure with respect to an undetected node (detection of 0/detection of 1), and detection of both 0 and 1 of degeneration failures.

According to the integrated circuit design apparatus of the present embodiment, a yield can be computed from a test pattern for each classification of undetected nodes taking into account graphics information which takes an undetected node as a target. By utilization of this yield information, highly-accurate computation of a market fraction defective (=1−a yield of undetected nodes) taking into account a graphic pattern of an undetected node as well as computing a market fraction defective from the failure detection rate information of the test pattern become feasible. The market fraction defective of a detected node is assumed to be zero as a precondition.

Figure 26:
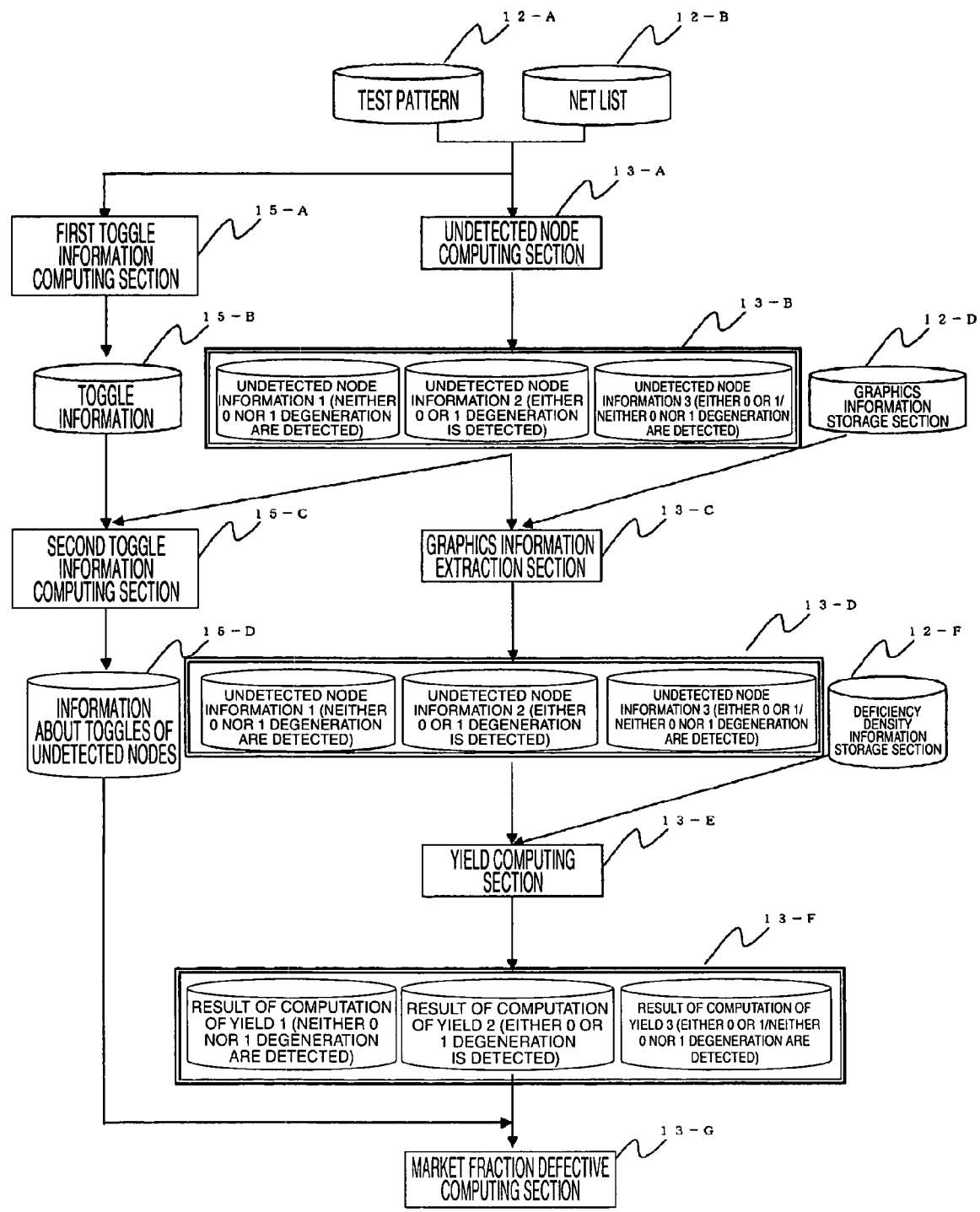
FIG. 26 is a block diagram showing an integrated circuit design apparatus of another embodiment.

When a market fraction defective is computed, toggle information (presence/absence of a toggle) as well as a yield of undetected nodes may also be added as a parameter. As shown in, e.g., FIG. 26, the integrated circuit design apparatus may also further comprise a first toggle information computing section 15-B for computing toggle information from a test pattern read from the test pattern storage section 12-A and the net list read from the net list storage section 12-B; and a second toggle information computing section 15-D for computing toggle information about undetected nodes from the toggle information acquired by the first toggle information computing section 15-B. The toggle information about undetected nodes computed by the second toggle information computing section 15-D is utilized as one parameter by the market fraction defective computing section 13-G. In this case, each of the yields can be weighted, and hence a market fraction defective can be computed more accurately.

Figure 27:
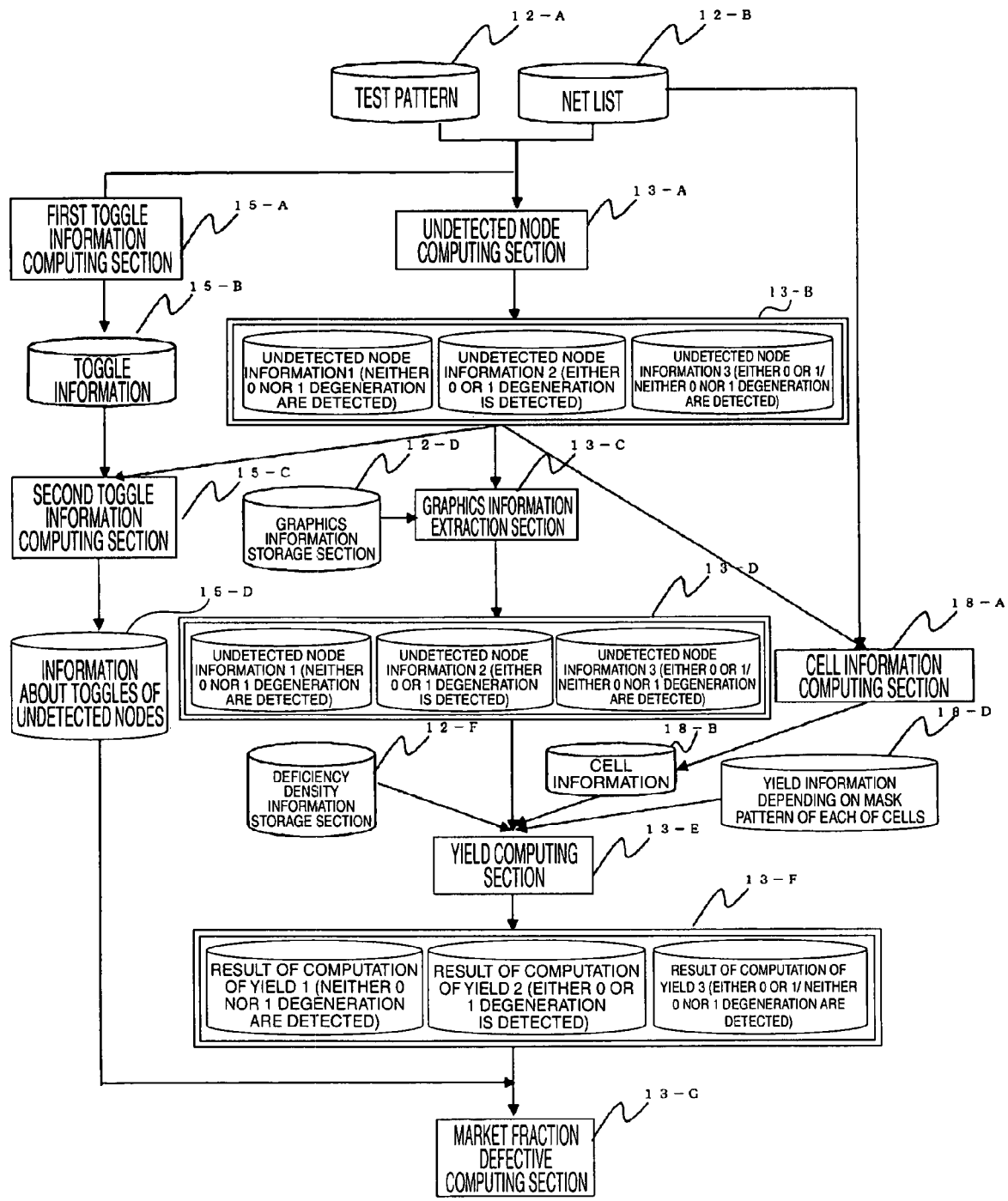
FIG. 27 is a block diagram showing an integrated circuit design apparatus of another embodiment.
Figure 28:
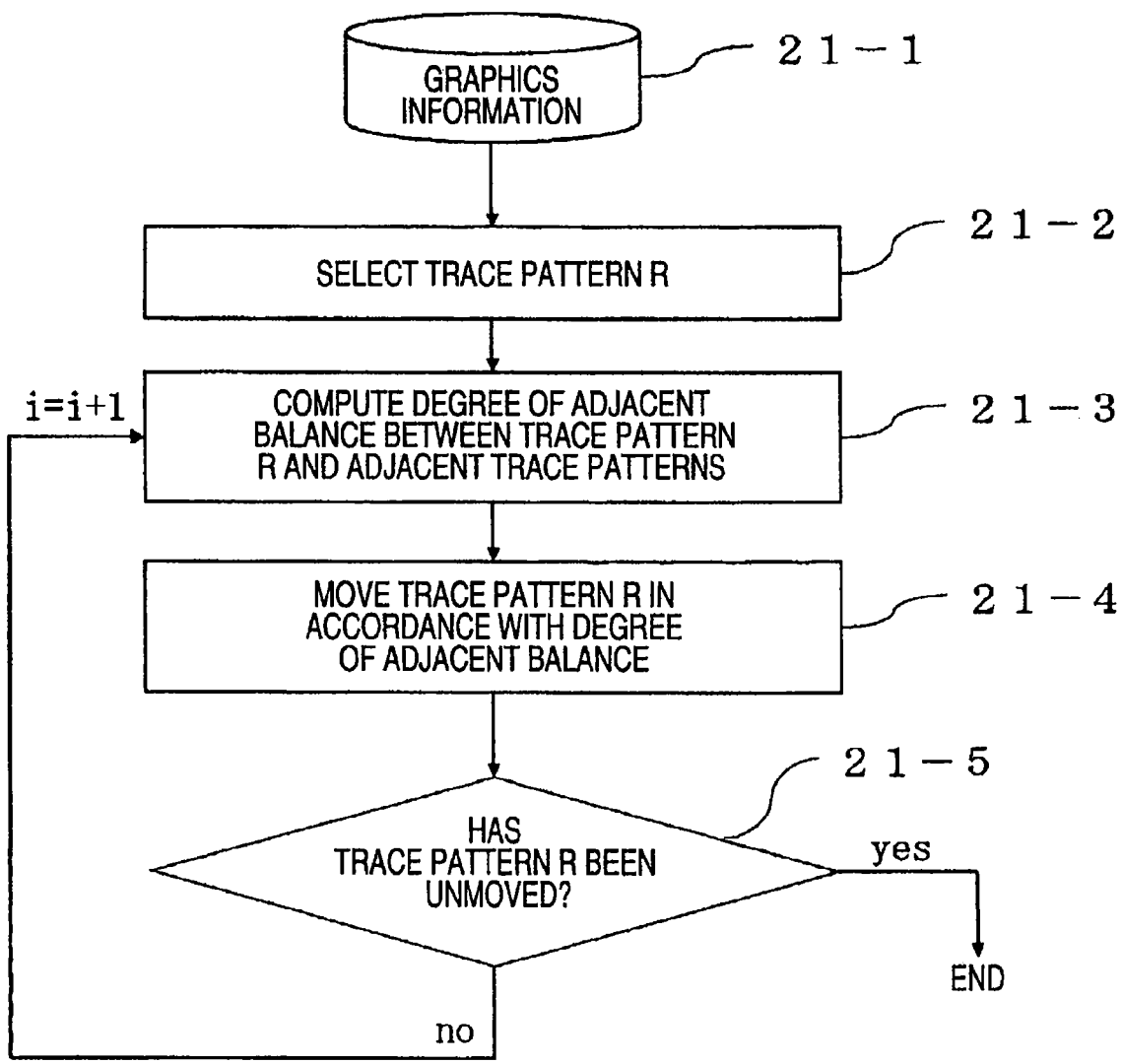
FIG. 28 is a flowchart showing a correction to the layout of a pattern of a related-art integrated circuit.

As shown in FIG. 27, the integrated circuit design apparatus may also comprise a cell information computing section 18-A for computing cell information including the types and number of cells connected to undetected nodes, or the like. The cell information computing section 18-A computes cell information by use of a net list stored in the net list storage section 12-B and undetected nodes computed by the undetected node computing section 13-A. The cell information computed by the cell information computing section 18-A and a failure (a parametric failure) depending on exposure of mask-pattern exposure of each of the cells are input to the yield computing section 13-E along with deficiency density information and the undetected node graphics information. In this case, the yield computing section 13-E computes a yield of each classification of undetected nodes from the cell information, a parametric failure, deficiency density information, and undetected node graphics information.

Moreover, the integrated circuit design apparatus may also make a correction to graphics information about the integrated circuit in order to enhance yields after having computed a market fraction defective. In this case, the market fraction defective can be diminished without making a correction to a test circuit or addition of a test pattern. In order to reduce the market fraction defective, a node to be corrected or a graphics pattern to be corrected can be determined from the undetected node information 13-B, the undetected node graphics information 13-D, and the computed yield 13-F. Therefore, before a correction is made to graphics information, the priority may also be assigned to nodes to be corrected.

The pattern correction apparatus, the pattern optimization apparatus, and the integrated circuit design apparatus of the present invention generate a pattern which enables enhancement of yields and a reduction in market fraction defective. Since quality of fine processes can be enhanced, the pieces of apparatus are useful as an apparatus for designing an integrated circuit.

What is claimed is:

1. A pattern correction apparatus which makes a correction to a pattern of an integrated circuit, comprising:
    a trace movement section for moving, among traces forming the pattern of the integrated circuit, a trace which is not present on trace grids to a position on the trace grids;
    a pattern correction section for making a correction to the pattern; and
    a trace pitch optimization section for optimizing a trace pitch between traces forming a pattern corrected by the pattern correction section,
    wherein the pattern correction section:
        creates graphics information about the corrected pattern,
        selects one trace from traces constituting the corrected pattern,
        determines whether the selected trace and traces adjacent to the selected trace have been changed as a result of correction of the pattern, and
        specifies, as a trace to be subjected to optimization of a trace pitch, the trace which has been determined to have been changed.

2. The pattern correction apparatus according to claim 1, wherein the trace pitch optimization section:
    selects one trace from the corrected pattern,
    determines whether or not the pattern correction section has designated the selected trace as a trace to be subjected to optimization of a trace pitch, and
    optimizes a trace pitch of the trace designated as a trace to be subjected to optimization of a trace pitch.

* * * * *